(12) United States Patent
Voutsas et al.

(10) Patent No.: US 6,900,083 B2
(45) Date of Patent: May 31, 2005

(54) METHOD OF FORMING MULTI-LAYERS FOR A THIN FILM TRANSISTOR

(75) Inventors: Apostolos Voutsas, Vancouver, WA (US); Yukihiko Nakata, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/945,063

(22) Filed: Aug. 31, 2001

(65) Prior Publication Data

US 2003/0042545 A1 Mar. 6, 2003

(51) Int. Cl.[7] .............................................. H01L 21/336
(52) U.S. Cl. ...................................... 438/151; 438/166
(58) Field of Search ................................ 438/149, 151, 438/166, 913, 908, FOR 201; 204/192.25

(56) References Cited

U.S. PATENT DOCUMENTS

| | | | | |
|---|---|---|---|---|
| 5,773,088 A | * | 6/1998 | Bhat | 427/294 |
| 6,458,635 B2 | * | 10/2002 | Yamazaki et al. | 438/149 |
| 6,506,635 B1 | * | 1/2003 | Yamazaki et al. | 438/148 |
| 2001/0000011 A1 | * | 3/2001 | Zhang et al. | 257/59 |
| 2001/0017683 A1 | * | 8/2001 | Hiroki et al. | 349/138 |
| 2001/0038099 A1 | * | 11/2001 | Yamazaki et al. | 257/72 |
| 2002/0006689 A1 | * | 1/2002 | Miyasaka | 438/149 |

OTHER PUBLICATIONS

Takashi Serakawa, Seiiti Shirai, Akio Okamoto and Shiro Suyama, *Low–Temperature Fabrication of High–Mobility Poly–Si TFT's For Large–Area LCS's*, 1998, IEEE Transactions of Electron Devices, vol. 36, pp 1929–1933.

Shiro Suyama, Akio Okamoto and Tadashi Serikawa, *Electrical Characteristics of MOSFET's Utilizing Oxygen–Argon Sputter–Deposited Gate Oxide Films*, 1987, IEEE Transactions on Electron Devices, vol. ED–34, No. 10, pp 2124–2128.

T. Serikawa and A. Okamoto, *Properties of Magnetron–Sputtered Silicon Nitride Films*, 1984 J. Electrochem.Soc: Solid State Science and Technology, vol. 131, No. 12, pp 2928–2933.

G.K. Giust, T.W. Sigmon, P.G. Carey, B. Weiss, G.A. Davis, *Los–Temperature Polysilicon Thin–Film Transistors Fabricated from Laser–P{rocessed Sputtered–Silicon Films*, 1998 Electron Device Letters, vol. 19, No. 9, pp343–344.

D.P. Gosain and S. Usui, *Poly–Si TFT Fabrication and Hydrogenation Using a Process Compatible With Plastic Substrates*, Electrochemical Society Proceedings vol. 98–22, pp 174–184.

F. Okumura and K. Yuda, *High–Quality Low–Temperature Gate Oxide For Poly–Si TFT's*, Electrochemical Society Proceedings, vol. 98–22, pp 133–142.

S./ Kawamura, T. Nishibe, N. Ibaraki, *P–2: Back–Channel Effects on the Threshold Voltage of Low–Temperature Poly–Si TFTs with $SiN_x/Si)_2$ Dual Under Layer*, 1999 SID 99 DIGEST, pp 456–459.

* cited by examiner

Primary Examiner—George Fourson
(74) Attorney, Agent, or Firm—Marger Johnson & McCollom P.C.

(57) ABSTRACT

The present invention concerns a method of forming multi-layers such as base-coat and active layers for TFTs. In accordance with the preferred embodiment of the present invention, a first layer is formed on a transparent substrate using a physical vapor deposition. And a second layer is sequentially formed using a physical vapor deposition on the first layer without breaking vacuum.

The present invention simplifies the TFT fabrication while decreasing the water or hydrogen content within multilayers including a base-coat (BC) layer.

7 Claims, 4 Drawing Sheets

US 6,900,083 B2

METHOD OF FORMING MULTI-LAYERS FOR A THIN FILM TRANSISTOR

BACKGROUND OF THE INVENTION

1. The Field of the Invention

This invention relates generally to the field of thin film transistors (TFT), and more particularly, to a method of forming a number of thin-layer materials used in the fabrication of thin-film-transistors (TFTs) for devices such as a liquid crystal display (LCD).

2. Description of the Related Art

In the manufacture of thin film transistor (TFT) liquid-crystal-displays (LCDs), the active region of the display consists of an array of pixels, built on a glass substrate. The TFTs are made by various typical semiconductor processes on the glass substrate.

Before fabricating the TFTs, in general, the glass substrate needs to be coated with a base-coat (BC) layer to prevent outdiffusion of impurities, typically present in the glass material, to the TFT layers. The most typical base-coat material is silicon dioxide that is deposited by conventional CVD (chemical vapor deposition) processes.

Unfortunately, the silicon dioxide formed in accordance with such conventional methods often has an unacceptably high water content degrading the performance of the TFTs. Thus, to obtain good TFT characteristics and reliability, it is essential that the water be removed from the BC layer.

For this reason, conventionally, the BC layer deposition is usually followed by extra annealing (densification) processes before it comes in contact with the subsequently deposited TFT layers.

However, such extra annealing processes complicate the fabrication of the TFTs and become a source of contamination. This is because, while the glass substrate is annealed and carried between annealing furnaces and deposition chambers, the surface of the BC layer is exposed to an ambient and accordingly is contaminated. Further, the removal of the water from the base-coat layer is difficult with such conventional methods, especially when the substrate is exposed to an ambient.

In other approaches, the use of a dual BC layer has been suggested as a way to alleviate the need for post-deposition annealing processes. In this case, a $SiN_x/SiO_2$ stack is deposited. The SiNx layer demonstrates good barrier properties, whereas the $SiO_2$ layer mainly improves the interface quality between the BC stack and the subsequently deposited TFT layers. This approach, however, requires deposition of two layers leading to more process steps and still cannot completely eliminate the —OH radicals trapped in the layers, as a result of the deposition chemistry.

Accordingly, there is a need for more efficient methods of forming thin film materials such as BC and active layers, while reducing the water or Si—OH content therein, with fewer or simplified process steps.

SUMMARY OF THE INVENTION

Multilayers such as base-coat (BC) and active layers are formed for TFTs. In accordance with the preferred embodiment of the present invention, a first layer is formed on a transparent substrate using a first physical vapor deposition. Subsequently, without breaking vacuum, a second layer is sequentially formed using a second physical vapor deposition on the first layer.

The present invention has advantages such as simplifying the TFT fabrication process while improving the device characteristics of the TFTs by lowering the water or hydrogen content of multilayers including the BC layer.

The foregoing and other objects, features and advantages of the invention will become more readily apparent from the following detailed description of a preferred embodiment of the invention that proceeds with reference to the accompanying drawings.

DETAILED DESCRIPTION

In the following description, numerous specific details are set forth to provide a thorough understanding of the present invention. However, one having ordinary skill in the art should recognize that the invention can be practiced without these specific details. In some instances, well-known process steps, device structures, and techniques have not been shown in detail to avoid obscuring the present invention.

The inventors of the present invention have determined that the sources of water contained in a silicon dioxide base-coat (BC) layer can be manifested in two main ways: (1) the water content resulting from Si—OH bonds in the silicon dioxide layer, (2) the water content resulting from absorbed water in the silicon dioxide layer upon exposure to an ambient.

The first source can be attributed to the deposition chemistry, i.e. interaction of H, O and Si as the layer is formed from precursors such as $SiH_4$ or tetraethylorthosilicate (TEOS). The second source depends upon the physical characteristics of the silicon dioxide layer, i.e. porosity, even as the densest layers will tend to absorb some water upon exposure to an ambient.

Figure 1:
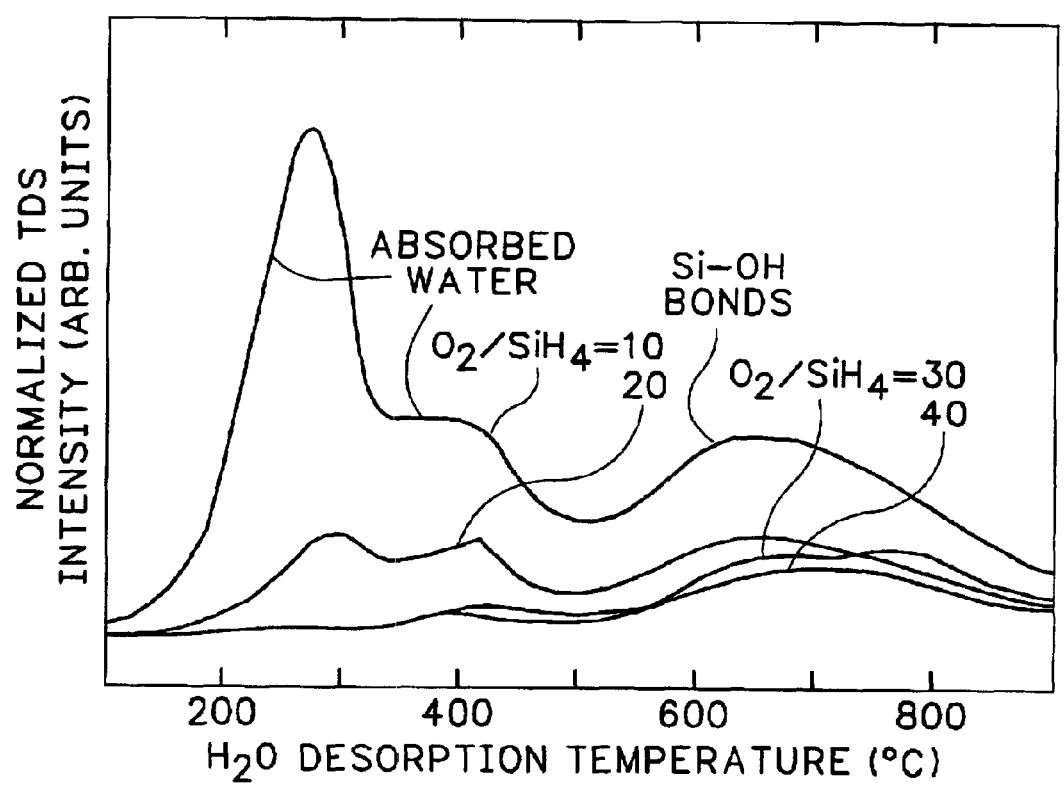
FIG. 1 illustrates water sources in the silicon dioxide layers prepared by RP-CVD.

FIG. 1 shows an example of the the two contributing water sources as identified by Thermal Desorption (TDS) experiments. The first two peaks in the TDS spectrum (~270° C. and ~400° C.) correspond to absorbed water in the silicon dioxide layer prepared by conventional methods such as Remote-Plasma CVD. The peak at ~600° C. corresponds to Si—OH bonds in the layer. It is believed that it is not possible to completely eliminate these bonds, a fact that may have consequences in the reliability of these layers.

Based upon these observations, the present invention contemplates, in general, methods of forming thin-film materials used in the fabrication of thin-film-transistors (TFTs). The preferred embodiment of the present invention also contemplates, among other things and in contrast to conventional methods, reducing the process steps while reducing the water content or hydrogen from the thin-film materials. The present invention accomplish this by dealing with each of the above mentioned water sources, as will be explained further below.

Figure 2A:
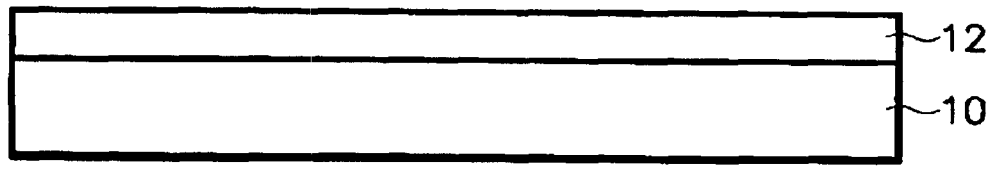
FIGS. 2A–2C schematically illustrate sequential phases of a method in accordance with an embodiment of the present invention.
Figure 2B:
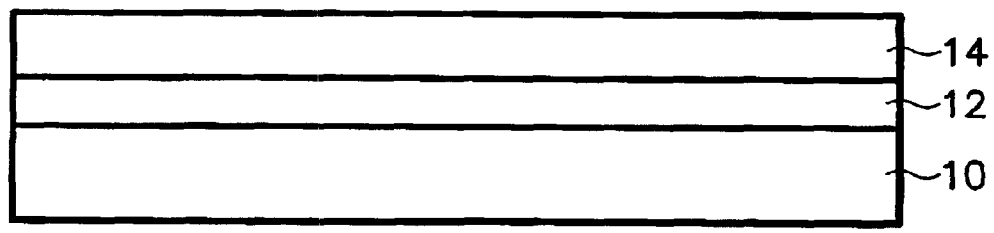
Figure 2C:
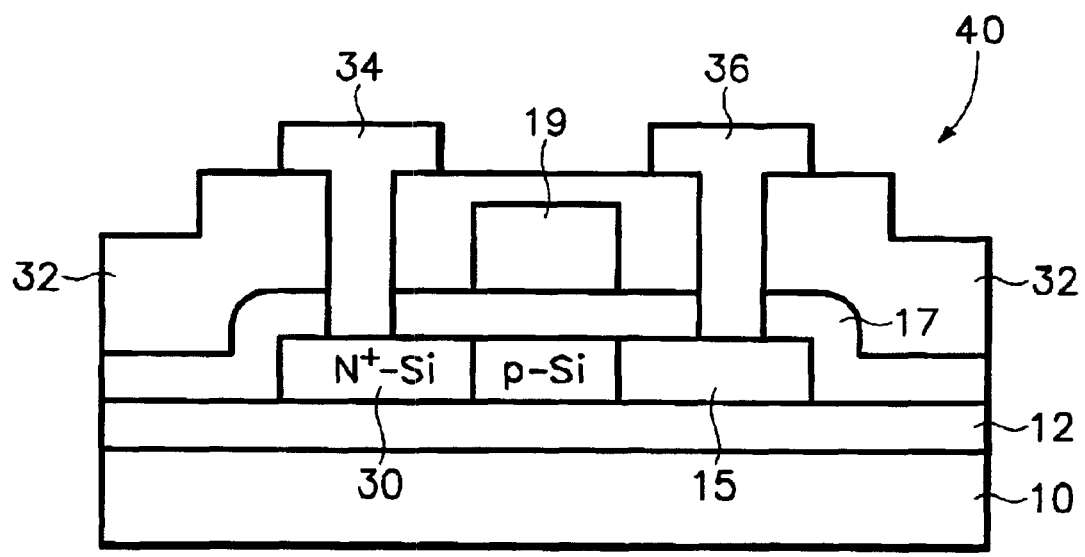

FIGS. 2A through 2C are cross-sectional views illustrating steps of manufacturing a thin film transistor in accordance with an embodiment of the present invention.

Referring to FIG. 2A, a transparent substrate 10 formed of an insulating material such as glass or any other suitable transparent material or semi-transparent material is provided in a first deposition chamber (not shown) to form a TFT 40, only a portion of which is shown here for the sake of clarity and simplicity.

Then, a barrier layer or a base-coat (BC) layer 12 is formed on the transparent substrate 10. In particular, a physical-vapor-deposition process (PVD) such as sputtering is used to deposit the BC layer 12 formed of a material such as silicon dioxide on the transparent substrate 10. During the deposition, a block of the material to be deposited ("sputtering target") is bombarded by plasma ions by applying an appropriate voltage to the target, which causes particles of the target material to be ejected from the sputtering target toward the transparent substrate 10 to deposit a desired layer.

In other words, under the influence of the electric field between the sputtering target and the substrate, the ionized species are accelerated towards the sputtering target and impart part of their energy to atoms of the target material. As a result of this interaction, some of the host atoms are ejected from the target body and are deposited onto the substrate 10. Thus, sputtering is a physical deposition process (i.e. no chemistry), hence, there are no hydrogen (H)-bearing species, which can produce —OH groups when combined with O atoms. Consequently, the first source of the water content can be substantially reduced in accordance with the present invention.

In addition to this advantage, sputtering is a well-suited method for the formation of the various Si-based, TFT layers because:

1. It is a safe and environmentally benign technique.

2. It can be used even at room temperature. Thus, it is compatible with any kind of substrate.

3. Silicon layers with very low $H_2$ content can be typically deposited (hence, there is no need for dehydrogenation to release excessive hydrogen). Alternatively, hydrogen can be incorporated into the layer if, and when, necessary.

4. It is a simpler and more easily scaled method than other conventional methods, which rely on chemistry.

Based on the observations described above and according to the preferred embodiment of the present invention, the BC layer 12, preferably approximately 100–200 nm thick, is formed on the transparent substrate 10 by physical vapor deposition processes such as reactive sputtering.

Figure 3:
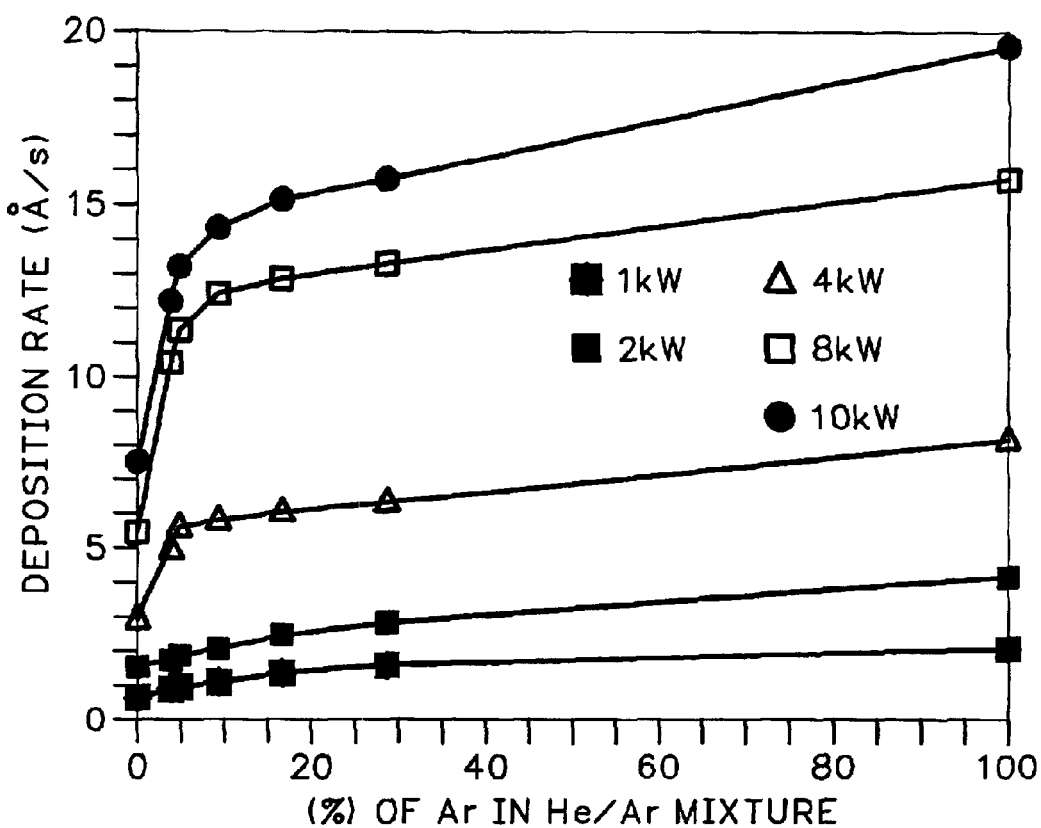
FIG. 3 is a graph showing a deposition rate as a function of power and the percentage of Ar in a sputtering gas.

In more detail, for the sputtering processes, a pulsed-DC, a regular DC, or DC magnetron sputtering process, preferably with a mixture of $H_2$, He and/or Ar+$O_2$ sputtering reaction gas can be used for the present invention. Here, the plasma typically consists of ionized Ar gas. However, the mixture of He/Ar can be also very effective (see FIG. 3). Preferably, approximately 3–20% Ar in Helium is used. If Ar is below 3%, the plasma characteristics are similar to those of pure He, which is not desirable for DC sputtering. If the Ar ratio is more than 20%, the plasma characteristics are similar to those of pure Ar, which is also undesirable. Other possible reactive gas mixtures consist of: oxygen and any one of Ar, Ne, or Kr; oxygen, He, and any one of Ar, Ne, or Kr. For forming the BC layer 12, a Si sputtering target such as single-crystalline silicon or polycrystalline silicon is utilized for the reactive sputtering. The Si target is preferably P-doped with resistivity of 1–50 Ohm-cm.

According to another embodiment, RF sputtering can be used to form the BC layer 12 with a gas mixture of Ar+$O_2$ or He/Ar+$O_2$ gas using a compound $SiO_2$ target. Percentage of Ar in He (in the case of He/Ar) varies according to optimization objectives.

Turning to FIG. 2B, without breaking vacuum, i.e., without exposing the substrate 10 to an ambient or atmosphere, the transparent substrate 10 is transferred to a second deposition chamber (not shown) from the first deposition chamber to subsequentially deposit an amorphous silicon (a-silicon) layer 14 on the BC layer 12. DC magnetron sputtering is preferably used with a mixture of He/Ar gas using a Si target (single crystalline silicon or polycrystalline silicon) that is P-doped with a resistivity of 1–50 Ohm-cm. However, other physical deposition processes within the spirit and scope of the invention can be used instead. Percentage of Ar in He gas varies according to optimization objectives.

The reduced plasma voltage, afforded by the He sputtering gas, is expected to be very beneficial for the case of dielectric layer deposition. In this case, plasma damage is typically responsible for the introduction of fixed charges in the insulating layers. Lower plasma voltage can reduce the plasma damage and, hence, increase the quality of the dielectric layer. To deposit an a-Si layer, a He/Ar gas mixture may also be used but at a different blend. A small hydrogen flow may also be added during the deposition of either of the layers 12, 14.

Given the significant reduction of OH groups in sputtered $SiO_2$ layers, the method of the present invention is very suitable for improving the bulk electronic properties (quality) of the BC layer 12. Furthermore, by utilizing a continuous (sequential) deposition mode, whereby the a-Si layer 14, is deposited on top of the BC layer 12 without breaking vacuum, reduction of the second water source can be achieved. This means that substantially no water will be absorbed in the BC layer 12, as the BC layer 12 is not exposed to ambient conditions between deposition steps. Hence, no separate annealing step needs to be implemented to improve its quality. Thus, with the present invention, the processing steps can be simplified and reduced.

Now referring to FIG. 2C, to form the TFT 40 for display devices such as LCD according to a preferred embodiment of the present invention, other portions of the TFT are subsequently formed using conventional techniques such as photolithography, ion implantation, and etching. For example, in the case of poly-Si (polysilicon) TFT, the a-silicon layer 14 is annealed to be crystallized into a polysilicon layer. The polysilicon layer is patterned to form a polysilicon layer pattern 15. A gate oxide layer 17 is then deposited over the polysilicon layer pattern 15. A conductive layer such as a metal layer is formed over the gate oxide layer 15. The conductive layer is then patterned to form a gate electrode 19. Subsequently, ion implantation is performed to form source/drain regions 30 in the polysilicon layer pattern 15. Next, a dielectric layer 32 such as low temperature silicon oxide (LTO) is formed thereon. Source and drain electrodes 34, 36 are formed through the gate oxide layer 17 and the dielectric layer 32 corresponding to source/drain regions 30. However, a person skilled in the art will appreciate that other TFT configurations such as a bottom gate structure within the spirit and scope of the present invention are contemplated.

Figure 4:
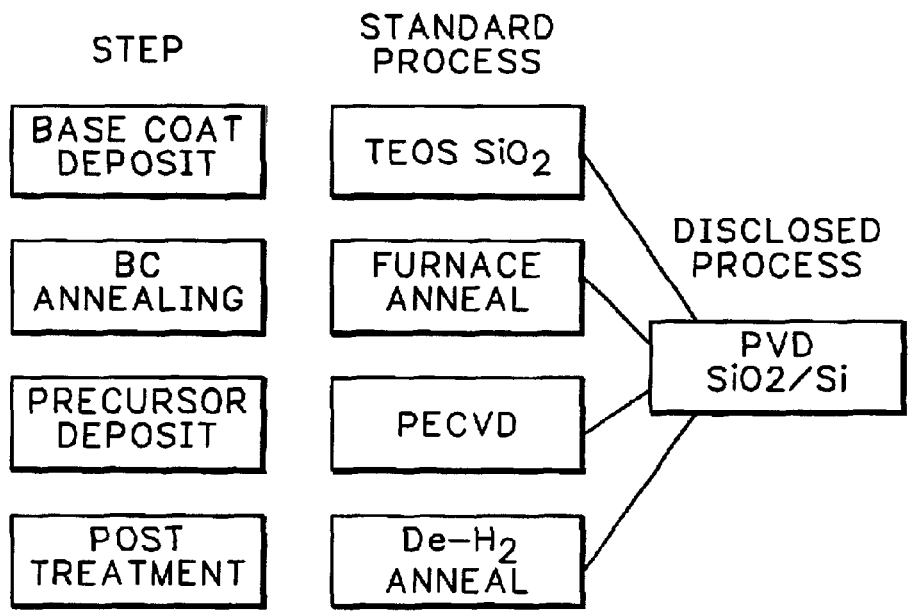
FIG. 4 shows diagrams comparing a conventional multi-layer formation process and a process in accordance with the preferred embodiment of the present invention.

FIG. 4 illustrates the advantages of the present invention by comparing the relevant parts of the TFT fabrication flow between the conventional and the disclosed process. As illustrated in FIG. 4, with the present invention sputtered BC and sequential deposition of BC/a-Si (both by sputtering), (a) the BC annealing step and (b) the dehydrogenation step for the a-Si layer (as PVD-Si has very low $H_2$ content) can be eliminated.

Figure 5:
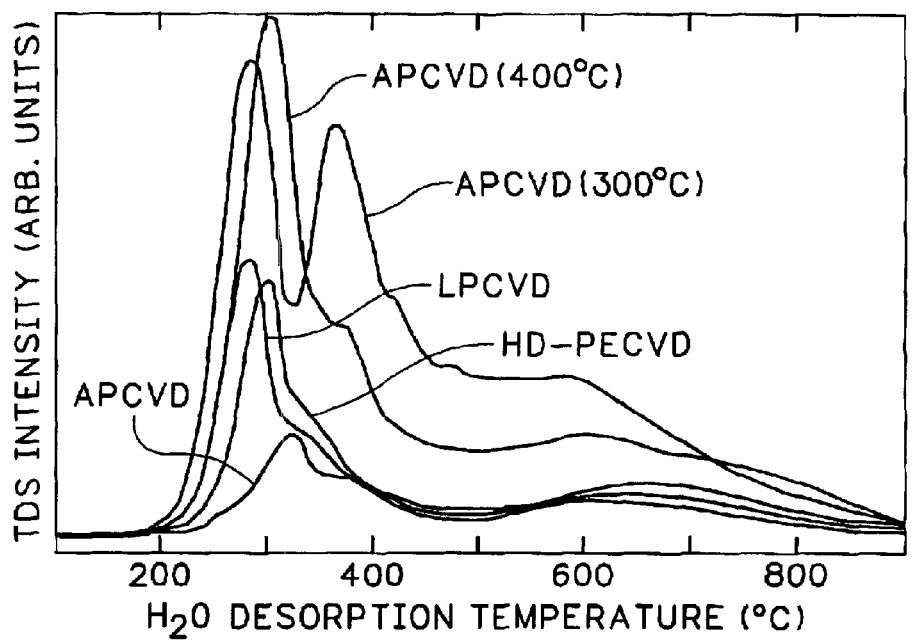
FIG. 5 illustrates water sources and relative magnitudes of water in various CVD $SiO_2$ layers.

To further explain the advantages of the present invention methods, referring to FIG. 5, all chemical vapor deposition (CVD) techniques result in measurable amounts of Si—OH groups and, moreover, the majority of the techniques produce layers demonstrating equally measurable water absorption. Since all these techniques rely in chemical decomposition of $Si_xH_y$ groups, and interaction with O to form silicon dioxide ($SiO_2$), Si—OH groups can be expected to form. However, in the case of PVD, no hydrogen is present in the vicinity of the layer (beyond background levels), hence, the formation of silicon dioxide occurs without the by-product formation of Si—OH groups.

Figure 6:
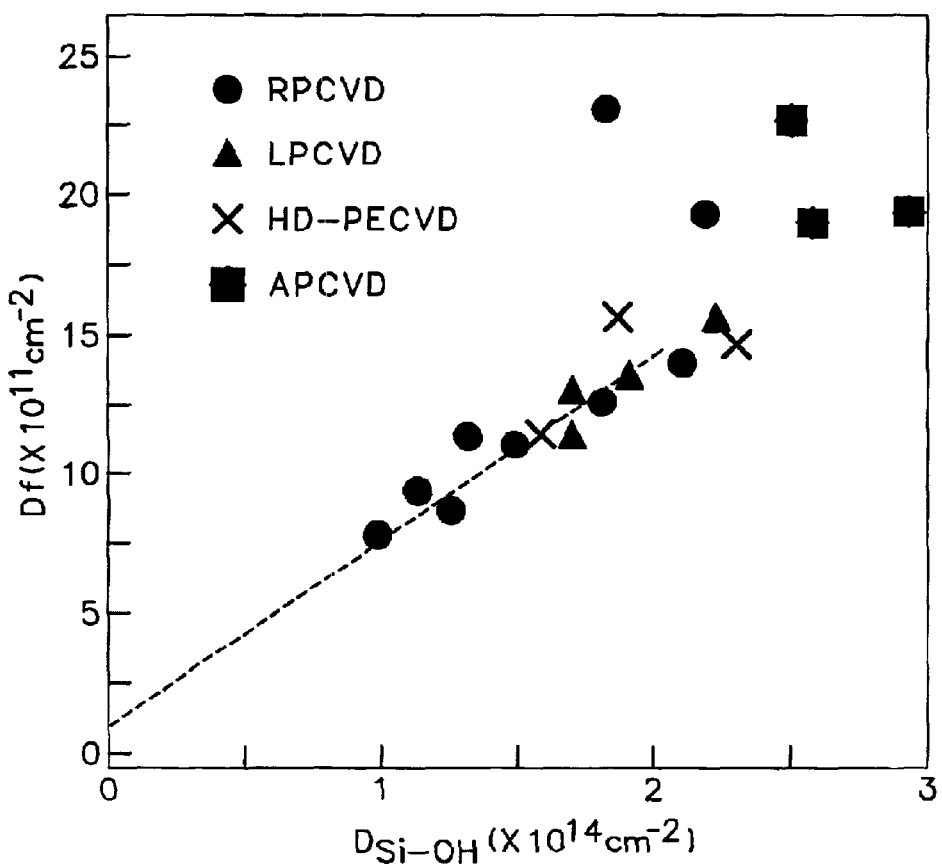
FIG. 6 illustrates a relationship between Si—OH density and fixed-charge density in the oxide layer prepared by various CVD methods.

Evidence of the relationship of the density of Si—OH groups and the quality of the oxide layer is shown in FIG. 6. In this case, the fixed-charge density (Df) of the oxide layer has been plotted against the density of Si—OH groups in the layer. Lower fixed-charge density is synonymous to higher quality oxide. A clear correlation can be inferred from the data of FIG. 6, where oxide has the lower density of Si—OH groups and thus is of higher quality.

By eliminating the Si—OH groups in the BC layer 12, significant improvement in the quality of the BC layer 12 can be achieved. This is accomplished by implementing the sputtering method for the deposition of the BC layer 12 and sequentially depositing an active layer (a-Si) without vacuum break to inhibit water absorption in the BC layer 12. Thus, extra annealing steps that are currently employed in the standard TFT fabrication process to improve the electrical characteristics of the BC layer 12 can be eliminated. Thus, in accordance with the present invention, process steps can be reduced.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming multi-layers for manufacturing a thin film transistor (TFT) using multiple process chambers, comprising:

forming a first layer of silicon dioxide for the thin film transistor on a glass substrate using a first non-chemical physical vapor deposition in a first process chamber;

transferring the substrate including the first layer to a second process chamber without breaking vacuum;

sequentially forming a second layer of amorphous silicon for the thin film transistor in the second process chamber using a second non-chemical physical vapor deposition on the first layer without breaking vacuum for fabricating the thin film transistor; and forming additional layers on top of the second layer for completing formation of the thin film transistor.

2. The method of claim 1, wherein the physical vapor deposition for forming the first layer and the second layer comprises pulsed-DC or RF sputtering.

3. The method of claim 1, wherein the first layer is formed using a gas mixture of Ar+$O_2$ using a $SiO_2$ target P-doped with a resistivity of 1–50 Ohms-centimeters.

4. The method of claim 3, wherein the first layer, the second layer and the additional layers form the thin film transistor into a liquid crystal display(LCD).

5. The method of claim 1, wherein said forming a first layer is performed by sputtering using a first target comprising silicon dioxide.

6. The method of claim 1, wherein said forming a second layer is performed by sputtering using a target formed of a material selected from the group consisting of single crystalline silicon and polycrystalline silicon.

7. The method of claim 1, wherein the physical vapor deposition for forming the second layer comprises regular-DC, pulsed DC or RF sputtering.

* * * * *